(12) United States Patent
Wernsman

(10) Patent No.: US 7,202,411 B1
(45) Date of Patent: Apr. 10, 2007

(54) PHOTOVOLTAIC AND THERMOPHOTOVOLTAIC DEVICES WITH QUANTUM BARRIERS

(75) Inventor: Bernard R. Wernsman, Jefferson Hills, PA (US)

(73) Assignee: United States of America Department of Energy, Washington, DC (US)

( * ) Notice: Subject to any disclaimer, the term of this patent is extended or adjusted under 35 U.S.C. 154(b) by 651 days.

(21) Appl. No.: 10/426,802

(22) Filed: May 1, 2003

(51) Int. Cl.
*H01L 31/06* (2006.01)
(52) U.S. Cl. ..................................... 136/255; 136/262
(58) Field of Classification Search .................. 136/255
See application file for complete search history.

(56) References Cited

U.S. PATENT DOCUMENTS 4,718,947 A * 1/1988 Arya ......................... 136/258
5,769,964 A * 6/1998 Charache et al. ........... 136/262
6,150,604 A * 11/2000 Freundlich et al. ......... 136/253

* cited by examiner

*Primary Examiner*—Nam Nguyen
*Assistant Examiner*—Anthony Fick
(74) *Attorney, Agent, or Firm*—Linda P. Field; Paul A. Gottlieb

(57) ABSTRACT

A photovoltaic or thermophotovoltaic device includes a diode formed by p-type material and n-type material joined at a p-n junction and including a depletion region adjacent to said p-n junction, and a quantum barrier disposed near or in the depletion region of the p-n junction so as to decrease device reverse saturation current density while maintaining device short circuit current density. In one embodiment, the quantum barrier is disposed on the n-type material side of the p-n junction and decreases the reverse saturation current density due to electrons while in another, the barrier is disposed on the p-type material side of the p-n junction and decreases the reverse saturation current density due to holes. In another embodiment, both types of quantum barriers are used.

16 Claims, 2 Drawing Sheets

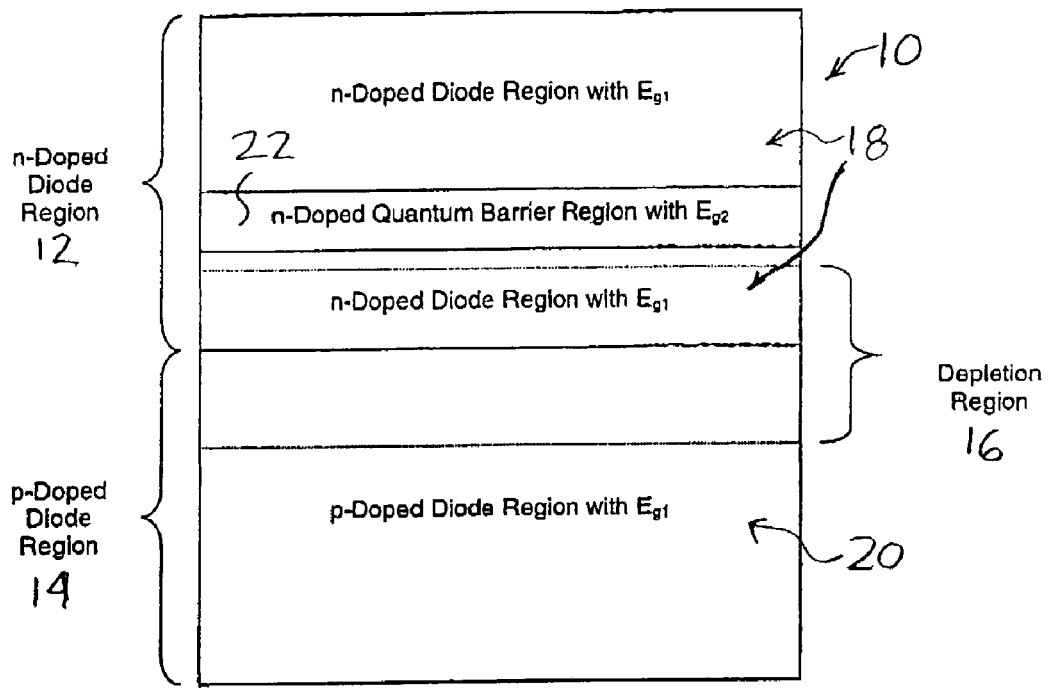
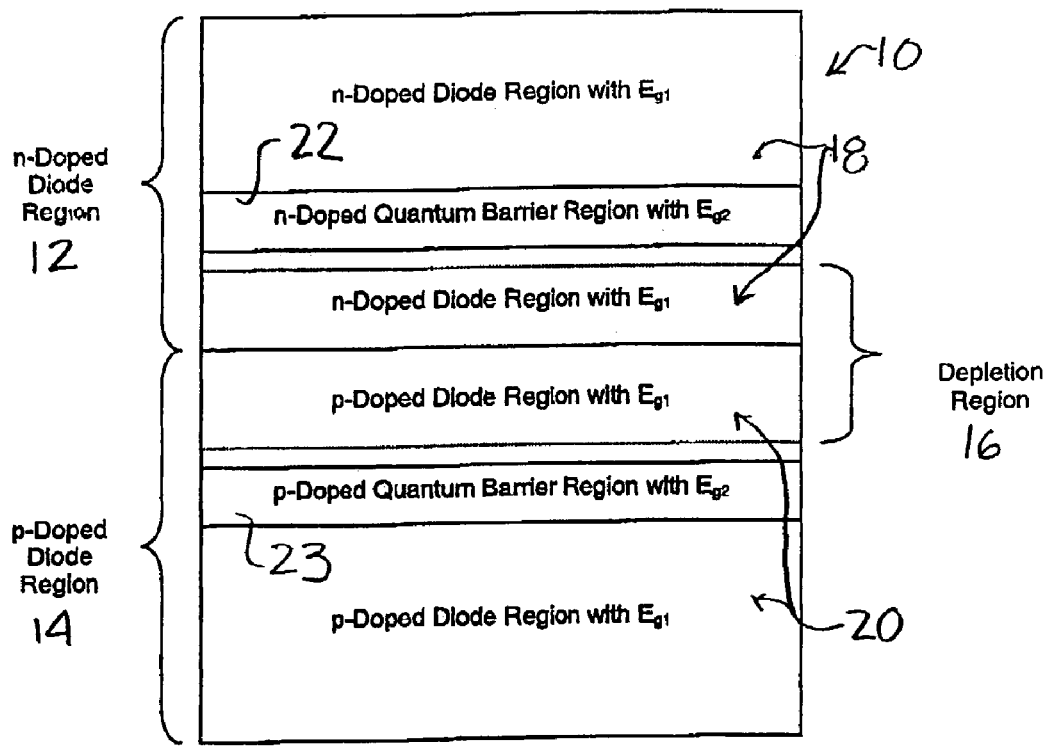

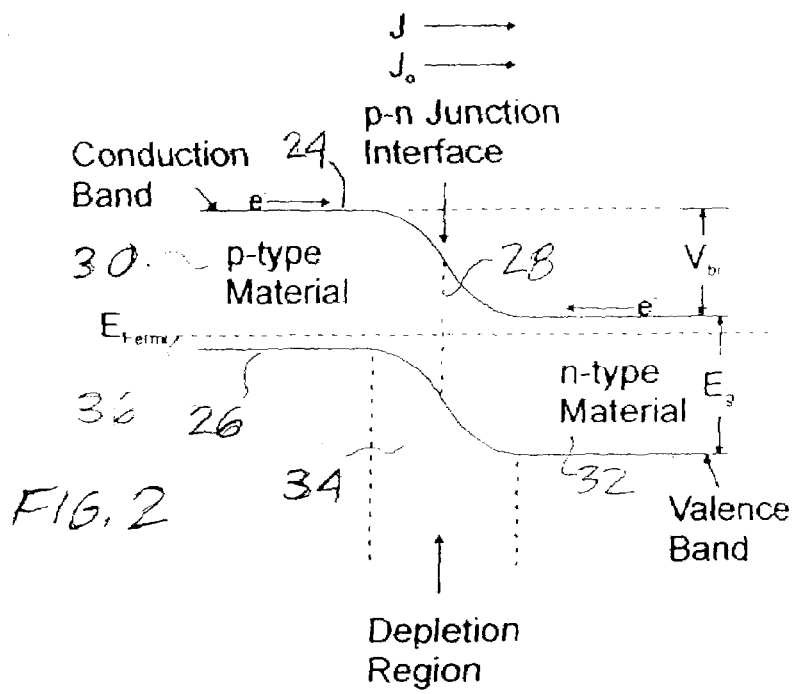
FIG. 2
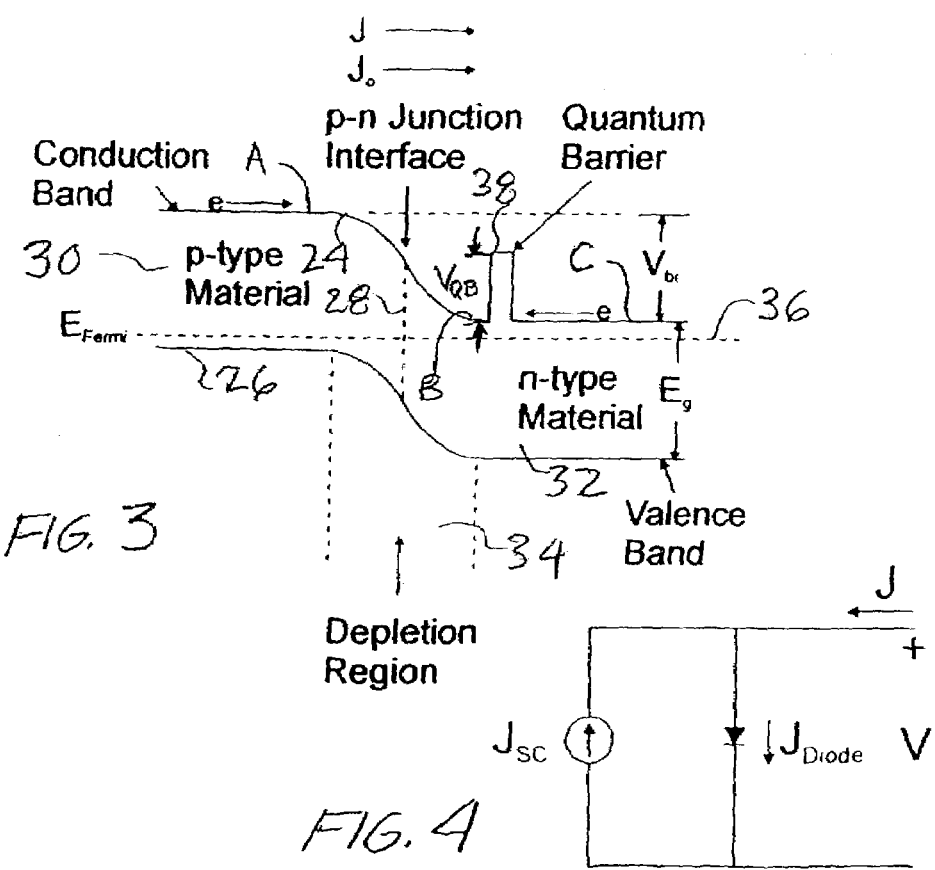
FIG. 3
FIG. 4

US 7,202,411 B1

PHOTOVOLTAIC AND THERMOPHOTOVOLTAIC DEVICES WITH QUANTUM BARRIERS

CONTRACTUAL ORIGIN OF THE INVENTION

The United States Government has rights in this invention pursuant to a contract between the United States Government and the Department of Energy.

FIELD OF THE INVENTION

The present invention relates to photovoltaic and thermophotovoltaic devices and, more particularly, to the provision in such devices of quantum barriers so as to enhance the output characteristics by reducing the reverse saturation current density while maintaining short circuit current density.

BACKGROUND OF THE INVENTION

Photovoltaics (PVs) and thermophotovoltaics (TPVs) are energy devices which are constructed from p-n junction diodes and which change electromagnetic energy (photons) into electrical energy. The form of photonic energy that is converted by PVs is mostly in the visible region while that for TPVs is mostly in the infrared region. The point of maximum output density ($PD_{max}$) for a PV/TPV device is at the point ($V_{max}$,-$J_{max}$) that occurs at the knee of the current density-voltage (J-V) curve for the device. This point also corresponds to the maximum efficiency ($n_{max}$) point for the device. Further, the ratio between $PD_{max}$ and the product of the open circuit voltage ($V_{oc}$) and short circuit current density ($J_{sc}$) is the fill factor (FF), a figure-of-merit for PV/TPV devices.

One of the parameters that determines the output performance ($PD_{max}$ and $n_{max}$) of PV and TPV devices is the reverse saturation current density ($J_o$). As $J_o$ increases, both $V_{oc}$ and FF decrease, thereby causing $PD_{max}$ and $n_{max}$ to decrease. If $J_o$ could be decreased without affecting $J_{sc}$, both $V_{oc}$ and FF would increase, thereby making $PD_{max}$ and $n_{max}$ larger.

SUMMARY OF THE INVENTION

In accordance with an important aspect of the invention, a method is provided for lowering the reverse saturation current density, $J_o$, without greatly affecting the short circuit current density, $J_{sc}$, so as to improve the conversion efficiency and output power density of conventional PV and TPV devices. The method of the invention involves the use of a quantum barrier or barriers and, in accordance with the invention, there is provided a semiconductor device, which is preferably either a photovoltaic device or a thermophotovoltaic device, comprising a diode comprising a p-type material and a n-type material joined at a p-n junction and including a depletion region surrounding the p-n junction; and a quantum barrier disposed at least near to or in the depletion region of the p-n junction so as to decrease device reverse saturation current density while maintaining device short circuit current density.

Preferably, the quantum barrier is epitaxially grown so as to be relatively defect free. This defect free barrier can be accomplished by growing the material either lattice matched or pseudomorphic to the diode.

In one important implementation, the quantum barrier is disposed on the n-type material side of said p-n junction and decreases the reverse saturation current density caused by electrons.

In a further important implementation, the barrier is disposed on the p-type material side of said p-n junction and decreases the reverse saturation current density caused by holes. It is noted that quantum barriers can be disposed on both sides of the p-n junction, and thus, in a further embodiment of this implementation, a further quantum barrier is disposed at least near to or in the depletion region on the n-type material side of the p-n junction so as to also decrease the reverse saturation current density caused by either electrons or holes.

In one advantageous embodiment, the device is a thermophotovoltaic device, and the device has a built-in voltage of 0.55 eV, a bandgap voltage of 0.6 eV and a quantum barrier potential of between about 0.01 and 10.0 eV. Advantageously, the device has a quantum barrier potential of between about 0.05 and 0.4 eV. In a specific implementation of interest, the diode is an InGaAs diode and the quantum barrier comprises GaAsSb. Advantageously, the device has a quantum barrier voltage of 0.11 eV. However, as explained below, other diode materials and other quantum barrier materials can also be used to advantage.

Further features and advantages of the present invention will be set forth in, or apparent from, the detailed description of preferred embodiments thereof which follows.

BRIEF DESCRIPTION OF THE DRAWINGS

FIG. 1 is a schematic side elevational view of a device in accordance with a first preferred embodiment of the invention;

FIG. 2 is a band diagram of a p-n junction without quantum barrier;

FIG. 3 is a band diagram of a p-n junction with a quantum barrier, in accordance with the first preferred embodiment of the invention;

FIG. 4 is a schematic circuit diagram used in explanation of the invention; and FIG. 5 is a side elevational view, similar to that of FIG. 1, of a further preferred embodiment of the invention.

DESCRIPTION OF THE PREFERRED EMBODIMENTS

Referring first to FIG. 1, which is a schematic cross sectional view of a first embodiment of the invention, there is shown a device, generally denoted 10, which includes a n-doped diode region 12, a p-doped diode region 14, and a depletion region 16 that includes adjacent parts of regions 12 and 14. The material bandgap energy is generally denoted $E_g$ and the n doped diode region comprises a n-doped region 18 with a bandgap energy $E_{g1}$ incorporating part of the depletion region 16, while the p-doped diode region comprises a p-doped region 20 with a bandgap energy $E_{g1}$ incorporating part of the depletion region 16.

As discussed in more detail below in connection with FIGS. 2 and 3, in accordance with this embodiment of the invention, a n-doped quantum barrier region 22 is located in region 18 in or near, i.e., at least close to, or partially or fully incorporated in depletion region 16. In this application, "near" or "close to" is defined as being within five times the mean free path (i.e., the average distance traveled before a collision occurs) of the high energy charge carriers (i.e., electrons going from the p to the n region or holes going from the n to p region). The bandgap energy, $E_{g2}$ of the barrier region 22 is greater than that of the other regions, i.e., $E_{g2} > E_{g1}$.

Referring to FIGS. 2 and 3 which are, respectively, band diagrams of a p-n junction without a quantum barrier, and with a quantum barrier in accordance with the invention, in both figures, the conduction band is denoted 24, the valance band 26, the p-n junction interface 28, the p-type material 30, the n-type material 32, the depletion region 34, the Fermi level 36 and the built-in potential $V_{bi}$ 37. In FIG. 3, the effect on the conduction band 24 by the quantum barrier provided in accordance with the present invention, i.e., is denoted 38 and, as illustrated, comprises an upwardly projecting portion of the conduction band 24.

The reverse saturation current $J_o$, which is indicated by the corresponding arrow in FIGS. 2 and 3, is determined from the sum of the number of holes flowing from left to right (p to n regions) and the number of electrons flowing from right to left (n to p regions), as viewed in FIGS. 2 and 3. Because the mobility of the electrons is much larger than that of the holes, the electron component is the main contributor to $J_o$. Because the reverse saturation current density $J_o$ is composed of electrons that have enough energy to overcome the potential barrier 37 set at the p-n junction interface 28, by providing the quantum barrier 38 as shown in FIG. 3 (and corresponding to quantum barrier 22 of FIG. 1), the flow of electrons is decreased and hence the reverse saturation current density $J_o$ is decreased. In other words, the reverse saturation current density $J_o$ is lowered because the quantum barrier 38 enhances the potential barrier 37 at the p-n interface 28 so that fewer electrons make it to the p-region.

Considering a specific example in connection with FIG. 3, and assuming that the effective mass of the electrons is 0.1 and assuming further that the built-in voltage is 0.55 eV and the bandgap, $E_g$, is 0.6 eV (a value which makes the device of this example a TPV device), with the electron energy distribution in the conduction band of the bulk n and p material given by the Boltzmann relationship, the electron energy distribution at points A and C of FIG. 3 are the same. At point B, two types of electrons exist, viz., electrons coming down the potential hill at the p-n junction from the p material to the n material (p–>n) and electrons from the n material that have made it over (i.e., through) the quantum barrier 38 and are going toward the p-material 30, i.e., toward the p-n junction 28 (n–>p). The p–>n electrons at point B have gained the built-in voltage $V_{bi}$ in energy (0.55 eV) making their Boltzmann energy distribution shift to higher energy by 0.55 eV. The number of n–>p electrons at point B is lower than that at point C, decreasing their Boltzmann energy distribution for all energies. This shift in electron energy of p–>n electrons and lowering of the number of available n–>p electrons, respectively, allows tunneling through the quantum barrier 38 and decreases the reverse saturation current density $J_o$. Thus, the reverse saturation current density JO decreases while the short circuit output current density $J_{sc}$ remains constant.

The relationship between $J_{sc}$ and $J_o$ will vary as a function of the quantum barrier height, denoted $V_{QB}$ in FIG. 3. In this regard, it has been shown in for the example discussed above, with $E_g$=0.6 eV and $_{v.i.}$=0.55 eV, and with the temperature, T, equal to 300/K and one half of the quantum barrier thickness, a, equal to 5 nm, that the ratio between the reverse saturation current density and its value at a barrier height of 0 eV($J_o(V_{QB}):J_o(V_{QB}=0$ eV)) decreases to about 0.1 as $V_{QB}$ increases to 0.05 eV. On the other hand, the ratio of the short circuit current density to short circuit density at $V_{QB}=0$ eV($J_{sc}(V_{QB}):J_{sc}(V_{QB}=0$ eV) does not significantly decrease until $V_{QB}$ is about 0.45 eV. Thus, by providing a quantum barrier with a height between 0.05 eV and 0.4 eV, $J_o$ is significantly decreased while $J_{sc}$ is maintained at a substantially constant value. The decrease in reverse saturation current density is quite significant and as the magnitude of $V_{QB}$ increases to 0.4 eV, the reverse saturation current density $J_o$ decreases by seven orders of magnitude more than the short circuit current density decreases.

Considering a further example, wherein a diode is made out of 0.6 eV InGaAs (making it a TPV device), using a phase diagram of binary III–V materials as provided in P. S. Dutta, H. L. Bhat and V. Kumar, "The Physics and Technology of Gallium Antimonide: An Emerging Optoelectronic Material," J. Appl. Phys., Vol. 81, pp. 5821–5870 (1997), it can be shown this corresponds to a lattice constant of about 5.9 Å and that, in order to eliminate possible defects in the material, the quantum barrier needs to be either matched to this value or grown pseudomorphic, some possible ternary quantum barriers are about 0.71 eV GaAsSb, about 0.95 eV InPAs and about 1.10 eV InPSb. By assuming that the material can be doped to vary its Fermi level and $V_{b1}$=0.55 eV, a band structure can be made wherein the valence band lines up with that of the n-type InGaAs layer. Further, GaAsSb is advantageously used for the barrier material, since this provides a barrier height $V_{QB}$ of 0.11 eV, which lies within the useful band for the InGaAs material system discussed above.

In another example, 0.55 eV InGaAsSb p-n junction is used with a 0.67 eV InGaAsSb quantum barrier, and, in this regard, it is important to note that other p-n junction materials with different bandgap values can be used along with different barrier materials. More specifically, the p-n junction can be made of any semiconductor material while the barrier can be any semiconductor material that has a bandgap energy larger than that of the diode. Examples include: (i) an InGaAs diode and InGaAsP barrier; (ii) an InGaAsSb diode and a GaSb barrier; (iii) an InGaAs diode and an InPAs barrier; (iv) an InGaAs diode and an InGaSb barrier; (v) a Ge diode and a SiGe barrier; and a GaAs diode and an AlGaAs barrier, among others. However, although this listing is not intended to be limiting and the basic requirement set forth above applies, i.e., any semiconductor material for the diode and barrier where the barrier bandgap energy is greater than that of the diode.

Turning again to the first example discussed above (using an InGaAs p-n junction), using the equivalent circuit shown in FIG. 4 wherein the diode current density $J_{diode}$ is connected across the device short circuit output current density $J_{sc}$, a comparison between a 0.6 eV TPV device with a GaAsSb quantum barrier, as in accordance with the present invention, and without such a barrier, as in a conventional device, is given in Table 1 below.

TABLE 1

0.6 eV InGaAs TPV Device Output Parameters With and Without a GaAsSb Quantum barrier for $V_{b1}$ = 0.55 eV, T = 300 K, a = 5 nm, $V_{QB}$ = 0.11 eV, $J_o$ = 1 mA/cm$^2$ (conventional device) and $J_{sc}$ = 1 A/cm$^2$.

| Output Parameter | Without Quantum Barrier (Conventional Device) | With Quantum Barrier |
|---|---|---|
| $J_{sc}$(A/cm$^2$) | 1.00 | 0.99 |
| $V_{oc}$(V) | 0.3567 | 0.4533 |
| FF(%) | 75.3 | 75.9 |
| PD$_{max}$(W/cm$^2$) | 0.268 | 0.341 |

It has also been shown that the output voltage for a 0.6 eV InGaAs TPV device as described is larger than that for a device without the barrier. The corresponding J-V curve for the device with a quantum barrier exhibits non-exponential behavior because the short circuit output current density $J_{sc}$ across the p-n junction decreases as the output voltage decreases. The decrease in $J_{sc}$ occurs because, as the output voltage decreases, the quantum barrier moves up and blocks $J_{sc}$.

The increase in output voltage provided by a device with a quantum barrier also increases the maximum output power density $PD_{max}$. Table 1 above gives the output parameters for the exemplary TPV device being considered, and as indicated therein, $PD_{max}$ increases from 0.268 W/cm$^2$ for a device without a quantum barrier to 0.341 W/cm$^2$ for a device with a quantum barrier, an increase of about 27%. This increase is due mainly to the increase in $V_{oc}$ because FF and $J_{sc}$ remain relatively the same.

A quantum barrier can also be used to hinder or reduce reverse saturation current density due to holes. A hole quantum barrier is created by changing the dopant of the barrier such that the barrier is in the valance band and placing the barrier on the p side of the p-n junction. The effect of such a quantum barrier on the reverse saturation current density due to holes is analogous to that on the reverse saturation current density due to electrons discussed above.

Quantum barriers can also be used to block or reduce the reverse saturation current density caused by both electrons and holes. In this regard, referring to FIG. 5, a further embodiment is shown wherein both types of quantum barriers are used. FIG. 5 is similar to FIG. 1 and corresponding reference numerals are used in both. FIG. 5 differs from FIG. 1 in that a further, p-doped quantum barrier 23 is placed in or near depletion region 16. It will, of course, be understood that the n-doped barrier region 22 can be omitted in the device of FIG. 5 so that only a hole barrier is provided as described in the preceding paragraph.

The quantum barriers provided in accordance with the invention are preferably produced by epitaxially growing a thin layer of material with a different bandgap than that of the diode in or near the depletion region of the diode. The method used can be similar to that used for quantum wells disclosed in K. Barnham, J. Connolly, P. Griffin, G. Haarpaintner, J. Nelson, E. Tsui, A. Zachariou, J. Osborne, C. Button, G. Hill, M. Hopkinson, M. Pate, J. Roberts and T. Foxon, "Voltage Enhancement in Quantum Well Solar Cells," J. Appl. Phys., Vol. 80, pp. 1201–1996, which is hereby incorporated by reference. The transmission of the barrier is given in R. L. Liboff, Introductory Quantum Mechanics, Holden-Day. Inc., Oakland, Calif., 1980. Reference is also made to P. S. Dutta, H. L. Bhat and V. Kumar, "The Physics and Technology of Gallium Antimonide: An Emerging Optoelectronic Material," J. Appl. Phys., Vol. 81, pp. 5821–5870, 1997.

Although the invention has been described above in relation to preferred embodiments thereof, it will be understood by those skilled in the art that variations and modifications can be effected in these preferred embodiments without departing from the scope and spirit of the invention.

What is claimed is:

1. A semiconductor device comprising:
  a diode comprising a p-type material and a n-type material joined at a p-n junction and including a depletion region surrounding said p-n junction; and
  a single quantum barrier disposed at least near to or in the depletion region of the p-n junction that decreases device reverse saturation current density wherein the single quantum barrier is in either one of i) a conduction band while maintaining device short circuit current density and maintaining the continuity of a valence band by aligning this band from the material with the corresponding band of the single quantum barrier, or ii) the valence band while maintaining device short circuit current density and maintaining the continuity of the conduction band by aligning this band from the material with the corresponding band of the single quantum barrier.

2. A device according to claim 1 wherein said single quantum barrier is epitaxially grown.

3. A device according to claim 1 wherein said single quantum barrier is disposed on the n-type material side of said p-n junction and decreases the reverse saturation current density due to electrons wherein the single quantum barrier is in the n-type material conduction band while the continuity of the n-type material and the single quantum barrier valence band is maintained via alignment.

4. A device according to claim 1 wherein said single quantum barrier is disposed on the p-type material side of said p-n junction and decreases the reverse saturation current density due to holes wherein the single guantum barrier is in the p-type material valence band while the continuity of the p-type material and the single quantum barrier conduction band is maintained via alignment.

5. A device according to claim 4 wherein a further quantum barrier is disposed at least near to or in the depletion region on the n-type material side of the p-n junction to decrease the reverse saturation current density due to electrons wherein the further quantum barrier is in the n-type material conduction band while the continuity of the n-type material and the further quantum barrier valence band is maintained via alignment.

6. A device according to claim 1 wherein the device comprises one of a photovoltaic device and a thermophotovoltaic device.

7. A device according to claim 6 wherein the device is a thermophotovoltaic device, and the device has a built-in voltage of about 0.55 eV, a bandgap voltage of about 0.6 eV and a quantum barrier potential of the single quantum barrier between about 0.01 and 10.0 eV.

8. A device according to claim 7 wherein said device has a quantum barrier potential of the single quantum barrier between about 0.05 and 0.4 eV.

9. A device according to claim 8 wherein said diode is an InGaAs diode and said single quantum barrier comprises GaAsSb.

10. A device according to claim 9 wherein said device has a single quantum barrier voltage of about 0.11 eV.

11. A device according to claim 1 wherein said diode comprises a 0.55 eV InGaAs p-n junction diode and said single quantum barrier has a quantum barrier potential of between about 0.01 and 10.0 eV.

12. A semiconductor device comprising one of a photovoltaic device and thermophotovoltaic device, said device including:
  a diode comprising a p-type material and a n-type material joined at a p-n junction, and including a depletion region adjacent to said p-n junction on opposite sides thereof; and a single quantum barrier disposed at least near to or in the depletion region on the n-type material side of said p-n junction to decrease the reverse saturation current density due to electrons wherein the single quantum barrier is in the n-type material conduction band while maintaining device short circuit current density and maintaining the continuity of the valence band by aligning said band from the n-type material with the corresponding band of the single quantum barrier.

13. A device according to claim 12 wherein the device is a thermophotovoltaic device, and the device has a built-in voltage of about 0.55 eV, a bandgap voltage of about 0.6 eV and a quantum barrier potential of the single quantum barrier between about 0.01 and 10.0 eV.

14. A device according to claim 13 wherein said device has a quantum barrier potential of the single quantum barrier between about 0.05 and 0.4 eV.

15. A semiconductor device comprising one of a photovoltaic device and thermophotovoltaic device, said device including:

a diode comprising a p-type material and a n-type material joined at a p-n junction having a depletion region adjacent to said p-n junction on opposite sides thereof; and a single quantum barrier disposed at least near to or in the depletion region on the p-type material side of said p-n junction to decrease the reverse saturation current density due to holes wherein the single quantum barrier is in the p-type material valence band while maintaining device short circuit current density and maintaining the continuity of the conduction band by aligning said band from the p-type material with the corresponding band of the single quantum barrier.

16. A device according to claim 15 wherein a further single quantum barrier is disposed at least near to or in the depletion region on the n-type material side of the p-n junction to decrease the reverse saturation current density due to electrons wherein the further single quantum barrier is in the n-type material conduction band and the continuity of the n-type material and further single quantum barrier valence band is maintained via alignment.

* * * * *